United States Patent [19]

Sun et al.

[11] 4,002,977

[45] Jan. 11, 1977

[54] MEASURING CIRCUIT

[75] Inventors: Shan C. Sun, Pittsburgh, Pa.;
Anthony G. Chaprnka, Cockeysville, Md.

[73] Assignee: Westinghouse Electric Corporation, Pittsburgh, Pa.

[22] Filed: July 24, 1975

[21] Appl. No.: 598,609

[52] U.S. Cl. .............................. 324/132; 324/115; 328/145

[51] Int. Cl.² .................... G01R 15/10; G06G 7/12

[58] Field of Search ............... 324/115, 132, 99 D, 324/99 R; 328/143, 144, 145; 307/230

[56] References Cited

UNITED STATES PATENTS 3,095,535  6/1963  Jaffe et al. ...................... 324/99 D
3,159,787  12/1964  Sexton et al. ...................... 324/132

*Primary Examiner*—Palmer C. Demeo
*Assistant Examiner*—Ernest F. Karlsen
*Attorney, Agent, or Firm*—M. P. Lynch

[57] ABSTRACT

An automatic gain control circuit functions to adjust the magnitude of an input signal supplied to a measuring circuit to a level within the dynamic range of the measuring circuit while a log-ratio circuit adjusts the magnitude of the output signal from the measuring circuit to the level of the input signal and optimizes the signal-to-noise ratio performance of the measuring circuit.

10 Claims, 3 Drawing Figures

MEASURING CIRCUIT

CROSS-REFERENCE TO RELATED APPLICATION

The subject matter of this application is related to the copending, co-filed patent application of A. Chaprnka, S. C. Sun and L. Vercellotti entitled "Technique For Extending The Range Of A Measuring Circuit", which has been assigned to the assignee of the present invention and is incorporated herein by reference.

BACKGROUND OF THE INVENTION

In conventional measuring circuits, such as RMS to DC and peak-to-peak measuring circuits, which respond to input signals whose magnitude varies with respect to time, the useful range of the measuring circuit is limited by its dynamic range. There is disclosed is the above-identified copending U.S. patent application, a technique for extending the useful range of a measuring circuit through the use of an input circuit which establishes the magnitude of an input signal within the defined dynamic range of the measuring circuit and an output circuit which responds to the output signal of the measuring circuit by re-establishing the magnitude at a level corresponding to the magnitude of the initial input signal.

In the invention described below, the output circiut of the above-referenced copending patent application is replaced by a log-ratio circuit which combines with an automatic gain control circuit to both extend the useful range of the measuring circuit and optimize the signal-to-noise ratio performance of the measuring circuit.

DESCRIPTION OF THE DRAWINGS

The invention will become more readily apparent from the following exemplary description in connection with the accompanying drawings.

DESCRIPTION OF THE PREFERRED EMBODIMENT

Figure 1:
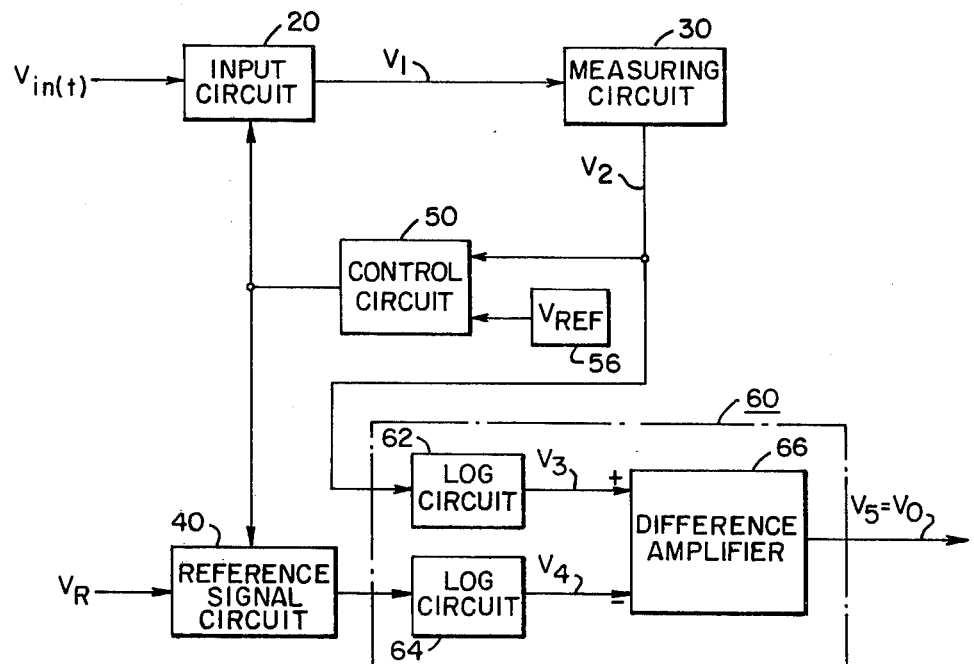
FIGS. 1 and 2 are schematic illustrations of embodiments of the invention.

Referring to FIG. 1, a circuit 10 is illustrated in block diagram form as including an input signal conditioning circuit 20, a measuring circuit 30, a reference signal circuit 40, a feedback control circuit 50 and a log-ratio circuit 60. The measuring circuit 30 shall, for the purposes of discussion, be considered an RMS to DC converter which develops a DC output signal representative of the RMS value of signals supplied by the input signal conditioning circuit 20. Suitable commercially available RMS to DC converters include Intronics circuit R310 and Analog Devices circuit AD440. The dynamic range of a typical measuring circuit is graphically illustrated in the log-log plot of FIG. 3. It is apparent from FIG. 3, that a measuring circuit has a preferred or defined dynamic range within which it is desirable to operate.

Figure 3:
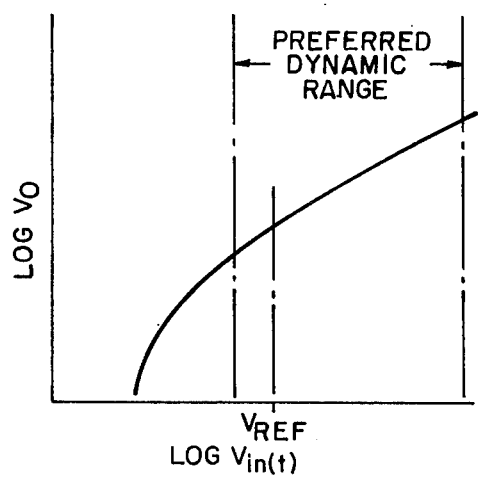
FIG. 3 is a graphical plot of the dynamic range of a conventional measuring circuit.

The feedback control circuit 50 compares the output signal $V_2$ from the measuring circuit 30 to a reference signal $V_{ref}$, which corresponds to a point in the dynamic range of circuit 30 as illustrated in FIG. 3, by supplying a control signal to the input signal conditioning circuit 20 to modify the magnitude of the input signal $V_{in}(t)$ to produce an output signal $V_1$ from the circuit 20 having a magnitude which approximates $V_{ref}$ and is within the dynamic range of the measuring circuit 30. The combination of the feedback circuit 50 and the input signal codnditioning circuit 20 functions as an automatic gain control circuit as described in detail in the above-referenced copending application. Suitable commercially available circuits for implementing the automatic gain control function include Analog Device circuits AD429, AD436 and AD532.

In the event the magnitude of the anticipated input signals are expected to vary to levels less than that required to fall within the dynamic range of the measuring circuit 30, the input signal conditioning circuit 20 will function as an amplifier with a gain factor A developed by the feedback circuit 50 as a function of the deviation of the input signal from the reference signal $V_{ref}$. The automatic gain control function provided by circuits 20 and 50 of FIG. 1 can be of any suitable design including that of an analog multiplier for a photoresistor-light source combination as described in detail in the above-reference copending application and illustrated in the detailed embodiment of FIG. 3. The log-ratio circuit 60 consists of two log circuits 62 and 64 having identical logarithmic characteristics and a difference amplifier circuit 66.

Assuming that all the circuits employed in FIG. 1 exhibit offset characteristics D and noise characteristics N and the magnitude of the input signal supplied to input signal conditioning circuit 20 varies with time and can be expressed $V_{in}(t)$, the operation of circuit 10 can be expressed as follows:

1. $V_1 = A\ V_{in}(t)$
2. $V_2 = AV$
3. $V_3 = K \log[AV+D+N]$
4. $V_4 = K \log AV_R$
5. $V_5 = K \log[AV+D+N] - K \log AV_R;\ AV \gg (D+N)$ therefore $V_5 = K \log AV/AV_R = K \log V/V_R$ where K is a constant term and is the scale factor for the log circuits 62 and 64, signal $V_1$ is the output signal from circuit 20, signal $V_2$ is the output signal from measuring circuit 30, signal $V_3$ and $V_4$ are the output signals for log circuits 62 and 64, respectively, signal $V_5$ is the output signal from the difference amplifier 66 and signal $V_R$ is a constant magnitude reference signal supplied to reference signal circuit 40. The magnitude of the signal $V_R$ is selected on the basis of both the circuit design and the anticipated magnitude of the input signal $V_{in}(t)$. The magnitude of signal $V_R$ is established such that the term $V/V_R$ is neither too large nor too small so as to make the magnitude of the output signal $V_5$ within practical limits. Since the term AV is significantly greater than the circuit noise term (D+N), the signal-to-noise performance is significantly improved.

In the embodiment of FIG. 1, wherein the measuring circuit 30 is assumed to be a true RMS to DC converter, a term $\overline{V}$ in equations (2), (3), (4) and (5) would be $\sqrt{\overline{V_{in}(t)^2}}$ and the output signal $V_5$ would be a logarithmic representation of the true RMS value of the input signal $V_{in}(t)$. Thus, the log-ratio circuit 60 functions to optimize the signal-to-noise performance of the circuit 30 as well as adjusting the magnitude of the output signal of the measuring circuit 30 to a level identical to that of the initial input signal $V_{in}(t)$.

Figure 2:
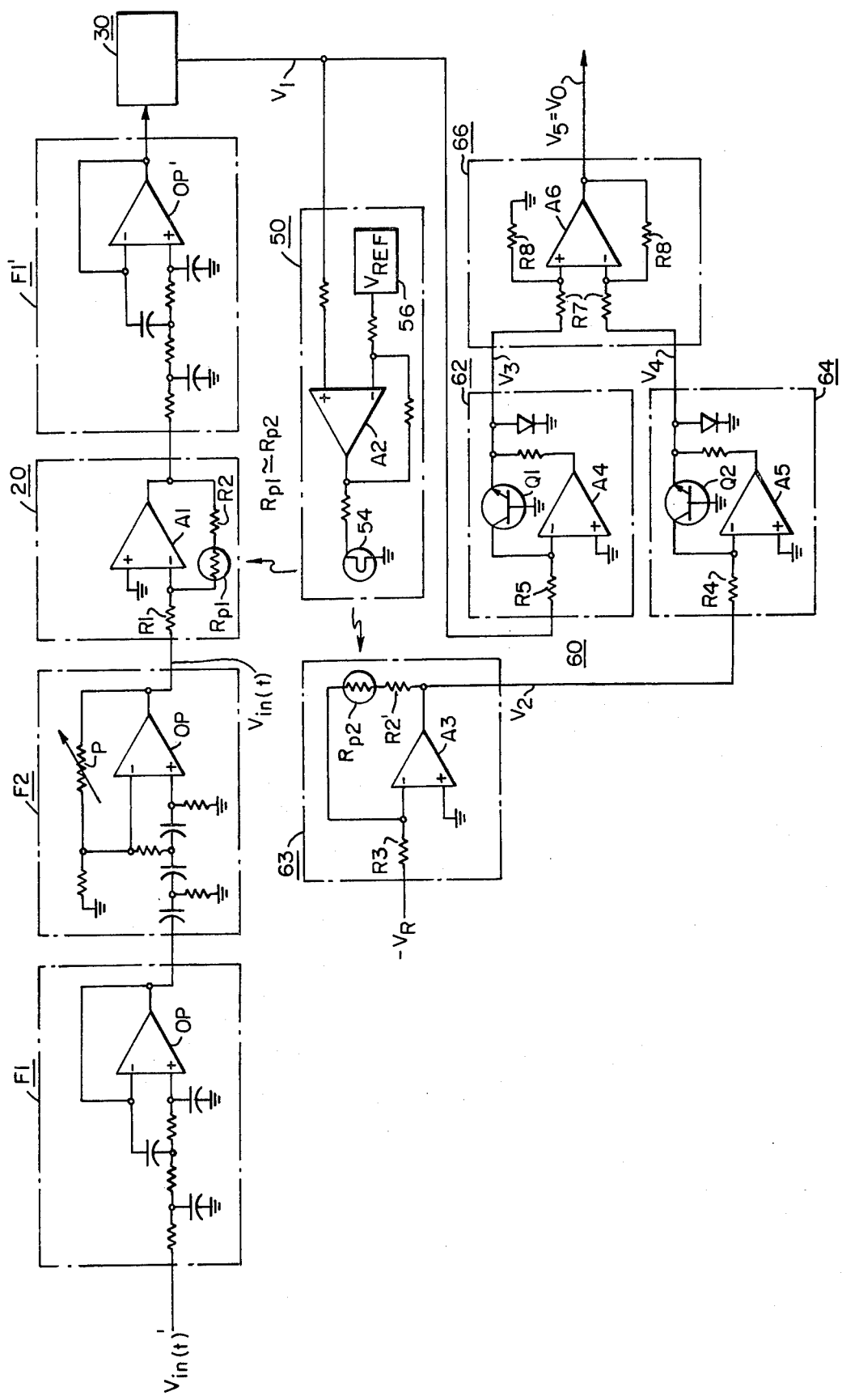

There is illustrated in FIG. 2 a detailed schematic illustration of an embodiment of the invention of FIG.

wherein the amplification factor A is a function of light intensity impinging on a pair of matched photoresistors within circuits 20 and 40 in accordance with the teachings of the above-referenced copending application.

The detailed schematic illustration of the embodiment of FIG. 2 not only illustrates a detailed embodiment of the invention of FIG. 1, but further a maximally flat type filter typically consisting of two 3rd order filter sections, a low pass section consisting of filter elements F1 and F1′, and a high pass filter section F2. The two 3rd order filter sections, which collectively satisfy the characteristics of a six pole Butterworth filter, are important when the input signal $V_{in}(t)$ exhibits a bandwidth beyond the limited bandwidth capabilities of the measuring circuit 30 in which case the filter sections function to render the measuring circuit 30 responsive to wideband input signals $V_{in}(t)′$.

While the maximally flat type filter may be of value depending on the application of the circuit 10, and as such will be discussed in detail later, the operation of the detailed embodiment of circuit 10 as shown in FIG. 2 is not dependent on the filter sections F1, F1′ and F2.

The automatic gain control function of the embodiment of FIG. 1 is implemented in FIG. 2 through the use of a matched pair of photoresistors $R_{P1}$ and $R_{P2}$ and a common light source 54.

The feedback control circuit 50 of FIG. 2 is illustrated as consisting of an amplifier A2 which responds to the deviation of the output signal from measuring circuit 30 relative to the reference signal $V_{ref}$ by changing the excitation signal supplied to the light source 54. The change in light level emitted by the light source 54 which impinges on the photoresistors $R_{P1}$ and $R_{P2}$ changes the amplification factor A of circuits 20 and 40. The input signal conditioning circuit 20 responds by adjusting the magnitude of the input signal $V_{in}(t)$ to a level within the dynamic range of the measuring circuit 30 which is comparable to the level represented by reference signal $V_{ref}$. The identical change in resistance of the photoresistors $R_{P1}$ and $R_{P2}$, as described in detail in the above-referenced copending application, change the gain characteristics of amplifiers A1 and A3 of circuits 20 and 40, respectively. Reference signal circuit 40 functions to apply the amplification factor A to the reference signal $V_R$ and apply the resulting signal as an input to the log circuit 64. As illustrated and described with reference to FIG. 1, the output of the measuring circuit 30 is applied as an input signal to the log circuit 62 of the log-ratio circuit 60. The log circuits 62 and 64 are schematically illustrated as consisting of operational amplifiers A4 and A5 respectively with closely matched transistors Q1 and Q2 connected in a feedback arrangement. The function of the log circuits 62 and 64 can be satisfied through the use of commercially available circuits such as the Analog Device circuit AD755. The output from the log circuits 62 and 64 are supplied to difference amplifier 66 herein illustrated as consisting of operational amplifier A6.

Assuming that the matched pair of photoresistors $R_{P1}$ and $R_{P2}$ and light source 54 provide the gain factor A as described with reference to FIG. 1, $K_1$ is the scale factor of the log circuits 62 and 64, and the measuring circuit 30 is assumed to be an RMS measuring circuit, the operation of the embodiment of FIG. 2 can be expressed as follows:

$$V_1 = [(R_{P1} + R_2)/R_1] \sqrt{V_{in}(t)^2}$$

$$V_2 = [(R_{P2} + R_2′)/R_3] V_R; (R_2 = R_2′)$$

$$V_3 = K_1 \log(V_1/R_5)$$

$$V_4 = K_1 \log(v_2/R_4)$$

$$V_5 = (K_1 R_N/R_7) [\log(V_1/R_5) - \log(V_2/R_4)] = (K_1 R_N/R_7) [\log(R_{P1} + R_2) + \log \sqrt{V_{in}(t)^2} - \log R_1 R_5 - \log(R_{P2} + R_2) - \log(V_R/R_3 R_4)]$$

Since $R_{P1}$ and $R_{P2}$ are closely matched photoresistors having a common light source, it implies that $R_{P1} = R_{P2}$. Thus $$V_5 = (K_1 R_N/R_7) \left[ \log(R_3 R_4/R_1 R_5 V_R) \sqrt{V_{in}(t)^2} \right]$$

Since $K_1$ and $V_R$ are constant, the above equation can be written as $$V_5 = K_2 \log K_3 \sqrt{V_{in}(t)^2}$$

where $$K_2 = K_1 R_N/R_7 \text{ and}$$

$$K_3 = R_3 R_4/R_1 R_5 V_R.$$

As discussed above, the 3rd order low pass filter section consisting of filter elements F1 and F1′, and the 3rd order high pass filter section consisting of filter element F2 are valuable additions to the circuit 10 when an input signal $V_{in}(t)′$ exhibits a bandwidth beyond the bandwidth capabilities of the measuring circuit 30. The splitting of the effective six pole Butterworth filter represented by filter sections F1, F1′ and F2 into one 3rd order low pass filter section and one 3rd order high pass filter section and the further splitting of the 3rd order low pass filter section into two filter elements F1 and F1′ provide a novel approach to filtering which both renders the measuring circuit responsive to wideband input signals $V_{in}(t)′$ and minimizes the effect of circuit noise produced by the circuit 20. The low pass filter section is split into two parts to improve wideband noise suppression. The combination of one-half of the low pass 3rd order filter section represented by filter element F1 in combination with the high pass 3rd order filter section represented by filter element F2 functions to limit the bandwidth of the input signal to produce an input signal $V_{in}(t)$ which is within the bandwidth capability of the measuring circuit 20. The second half of the 3rd order low pass section represented by filter element F1′, which is connected in series between the input signal conditioning circuit 20 and the measuring circuit 30, functions to minimize the effect of noise introduced by the input signal conditioning circuit 20. While the filter sections are schematically illustrated as consisting of operational amplifiers OP forming active filter elements, the bandwidth and noise filtering function can be achieved through the use of passive filter elements or a combination of passive and active filter elements.

The high pass 3rd order filter section F2 is illustrated as including a variable resistor P in a feedback arrangement to provide adjustable gain capabilities which can be used to normalize the input signal $V_{in}(t)′$.

We claim:
1. The combination of:
a signal measuring circuit means having an input and a output, and a defined dynamic range;
an input circuit means connected to said input of said signal measuring circuit means to adjust the magni- tude of an input signal in response to a control signal to a level within said defined dynamic range and supply the resulting adjusted signal to said signal measuring circuit means, said signal measuring circuit means producing a first output signal corresponding to a predetermined characteristic of the adjusted signal;

a reference signal circuit means for adjusting the magnitude of a predetermined reference signal in response to said control signal and developing a second output signal indicative thereof;

control circuit means for developing said control signal; and an output circuit means, including a log-ratio circuit means, for restoring the magnitude of said first output signal to a level corresponding to said input signal and restoring the magnitude of said second output signal to the level of said predetermined reference signal and producing a third output signal which is the log-ratio of the restored first and second output signals.

2. The combination of claim 1 wherein said control circuit means is operatively connected between the output of said signal measuring circuit means and both said input circuit means and said reference signal circuit means, said control signal being a function of the deviation of said first output signal from a predetermined location within said defined dynamic range.

3. The combination as claimed in claim 2 wherein said control circuit means includes a comparator circuit for comparing the magnitude of said first output signal with the magnitude of a secodnd predetermined reference signal representative of said defined dynamic range.

4. The combination of claim 1 wherein said log-ratio circuit consists of first and second identical log circuits and a difference circuit, said first output signal being supplied as an input signal to said first log circuit and said second output signal being supplied as an input signal to said secodnd log circuit, the outputs of said first and secodnd log circuits being supplied as inputs to said difference circuit, said difference circuit producing an output signal which is the log-ratio of the restored first and second output signals.

5. The combination as claimed in claim 2 wherein said input circuit means includes a first photoresistor and said reference signal circuit means includes a second photoresistor said control circuit means includes a light source for simultaneously directing light energy onto said photoresistors, said impinging light energy being said control signals, the intensity of said light energy being a function of the deviation of said first output signal from a predetermined location within said defined dynamic range.

6. The combination of claim 1 wherein said signal measuring circuit means is an RMS measuring circuit means.

7. The combination as claimed in claim 2 wherein said input circuit means is an amplifier and said control signal corresponds to an amplification factor, the combination of said control circuit means and said amplifier comprising an automatic gain control circuit.

8. The combination as claimed in claim 1 further including the combination of a high pass filter section and a first low pass filter section at the input of said input circuit means to compensate for input signals having bandwidths outside the bandwidth capability of said signal measuring circuit means and a second low pass filter section connected between said input circuit means and said signal measuring circuit means to compensate for signal noise introduced by said input circuit means.

9. The combination as claimed in claim 8 wherein said high pass filter section is a 3rd order high pass filter and said first and second low pass filter sections are each one-half of a 3rd order low pass filter.

10. The combination as claimed in claim 8 wherein said filter sections function a maximally flat type Butterworth filter.

* * * * *